(12) United States Patent
Huang et al.

(10) Patent No.: US 7,128,805 B2
(45) Date of Patent: Oct. 31, 2006

(54) MULTIPLE ELLIPTICAL BALL PLASMA APPARATUS

(75) Inventors: Wen-Liang Huang, Hwalien Hsien (TW); Ting-Wei Huang, Hsinchu (TW); Jau-Chyn Huang, Hsinchu (TW); Ching-Sung Hsiao, Hsinchu (TW); Ju-Chia Kuo, Pin-Cheng (TW)

(73) Assignee: Industrial Technology Research Institute, Hsinchu (TW)

( * ) Notice: Subject to any disclaimer, the term of this patent is extended or adjusted under 35 U.S.C. 154(b) by 431 days.

(21) Appl. No.: 10/640,740

(22) Filed: Aug. 13, 2003

(65) Prior Publication Data

US 2005/0034670 A1    Feb. 17, 2005

(51) Int. Cl.
*H01L 21/306* (2006.01)
*C23C 16/00* (2006.01)

(52) U.S. Cl. .................. 156/345.41; 118/723 MW

(58) Field of Classification Search ....... 118/723 MW, 118/723 ME, 723 MA, 723 MR; 156/345.36, 156/345.41, 345.42
See application file for complete search history.

(56) References Cited

U.S. PATENT DOCUMENTS

| 4,913,929 | A | * | 4/1990 | Moslehi et al. | ............. 427/564 |
|---|---|---|---|---|---|
| 4,940,015 | A | * | 7/1990 | Kobashi et al. | ....... 118/723 AN |
| 5,133,825 | A | * | 7/1992 | Hakamata et al. | ..... 156/345.42 |
| 5,954,882 | A | * | 9/1999 | Wild et al. | ........... 118/723 MW |
| 6,645,343 | B1 | * | 11/2003 | Wild et al. | .............. 156/345.41 |
| 6,670,741 | B1 | * | 12/2003 | Ishii | ....................... 313/231.31 |

* cited by examiner

*Primary Examiner*—Luz Alejandro-Mulero
(74) *Attorney, Agent, or Firm*—Pro-Techtor Int'l Services

(57) ABSTRACT

A plasma generating device, has a plurality of cavities shaped like half-ellipsoids, a plasma cavity, and microwave sources. The present invention takes advantage of geometrical properties of the propagation of electromagnetic waves by enclosing an electromagnetic field in the microwave range in overlapping cavities that together are shaped like a plurality of half ellipsoids. Each of the cavities has a first focus and a second focus, with the first foci of the cavities place close to each other. Microwaves entering the cavities at the second foci propagate inside the cavity and are focused at the first foci. The area around the first foci of both half ellipsoids forms a plasma cavity, providing a large volume filled with a microwave field. Thereby an increased volume of an electromagnetic field and thus of a plasma is achieved.

10 Claims, 3 Drawing Sheets

MULTIPLE ELLIPTICAL BALL PLASMA APPARATUS

BACKGROUND OF THE INVENTION

1. Field of the Invention

The present invention relates to a plasma generating apparatus, particularly to a plasma generating apparatus having a cavity that is shaped like a half ellipsoid, providing a large volume filled with plasma.

2. Description of Related Art

In the semiconductor industry, plasma is widely employed for various processes, e.g., for sputtering of membranes, PECVD and dry etching. Currently, generating plasma in extended volumes is a technology that is still at a beginning stage. Importing microwave components for use in the semiconductor industry in Taiwan is expensive, and maintenance is not easy. Generating plasmas in extended volumes is still fraught with many difficulties, like instabilities and insufficiently large volumes of plasma. Improving on theses shortcomings and permitting effective volumes of plasma that are large is therefore desirable.

SUMMARY OF THE INVENTION

It is an object of the present invention to provide a plasma generating apparatus which generates a stable plasma having an extended volume.

The present invention takes advantage of geometrical properties of the propagation of electromagnetic waves by enclosing an electromagnetic field in the microwave range in overlapping cavities that together are shaped like a plurality of half ellipsoids. Each of the cavities has a first focus and a second focus. Microwaves entering the cavities at the first foci propagate inside the cavity and are focused at the second foci. In a first embodiment of the present invention, the plurality of cavities is formed by two half ellipsoids. Microwaves are input at the first foci and are subsequently focused on the second foci of each of the half ellipsoids. The area around the second foci of both half ellipsoids forms a plasma cavity, providing a large volume filled with an electromagnetic field. Thereby an increased volume of an electromagnetic field and thus of a plasma is achieved.

In the present embodiment, a field regulating device is provided, having a means for vertically adjusting the plasma. Preferably, a control rod carrying a metal ball on a free end is used. By shifting the metal ball, the electromagnetic field is distorted. Shifting of the rod and the metal ball is achieved by using a gear.

In an embodiment of the present invention, a power distributing device distributes power to the microwave sources in the half ellipsoids.

The present invention can be more fully understood by reference to the following description and accompanying drawings.

DETAILED DESCRIPTION OF THE PREFERRED EMBODIMENTS

Figure 1:
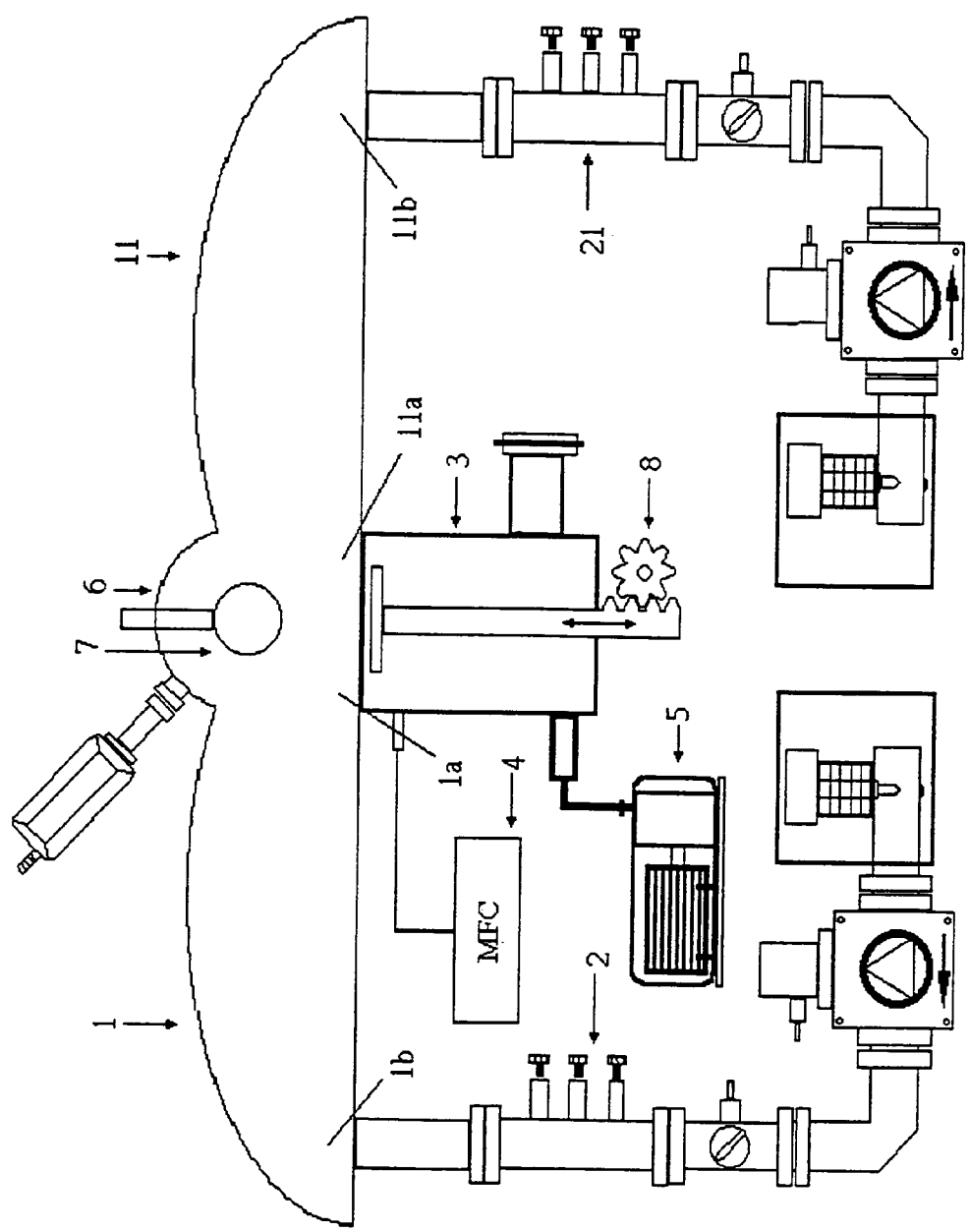
FIG. 1 is a schematic illustration of the plasma generating device of the present invention in the first embodiment.

In the following explanation, a first embodiment of the present invention employing two half ellipsoids as a cavity is taken as an example. As shown in FIG. 1, the present invention has a first cavity 1 and a second cavity 11, each of the first and second cavities 1, 11 is shaped like a half ellipsoid. The first and second cavities 1,11 are oriented in the same way, with main axes along a horizontal direction and convex surfaces thereof oriented upwards. The first half cavity has two foci 1$a$, 1$b$, and the second half cavity has two foci 11$a$, 11$b$. The first foci 1$a$, 11$a$ are located close to each other. A plasma cavity 3 is placed in a space around the first foci 1$a$, 11$a$. Wave guiding devices 2, 21 lead to the first and second cavities 1, 11 at the second foci 1$b$, 11$b$ thereof, respectively. Electromagnetic waves that originate from the second foci 1$b$, 11$b$ are reflected on the inner walls of the first and second cavities 1,11, focusing on the first foci 1 $a$, 11 $a$. Since the first foci 1 $a$, 11 $a$ are placed in an upper part of the plasma cavity 3, reaction gas inside the plasma cavity will be ionized, forming plasma. A gas feeding device 4 provides the plasma cavity 3 with reaction gas. As reaction gas, methane, carbon dioxide or gas containing carbon atoms is preferably used. A pumping device 5 controls pressure within the plasma cavity 3.

A top part of the plasma cavity 3 is formed by a spherical space 6, surrounding the first foci 1$a$, 11 $a$. The spherical space 6 and the first and second cavities 1,11 together form a butterfly-like pattern with two outer half ellipsoids and a central sphere. The spherical space 6 houses a sensor device for observing the plasma distribution at the wave guiding devices 2, 21 and the foci. Furthermore, the spherical space 6 accommodates a field regulating device 7 for controlling the electromagnetic field distribution inside the plasma cavity 3. Preferably, the field regulating device 7 has a control rod with a free end, on which a metal ball is set. By vertically shifting the metal ball, the electromagnetic field in the plasma cavity 3 is adjusted. The control rod has teeth, allowing to be engaged by a gear to be shifted upward and downward. The plasma cavity 3 is a cylindrical hollow body, on which a quartz glass plate is laid. On a lower end of the plasma cavity 3, a vertical shifting device 8 is installed, having an upper end with a carrier plate, so that the carrier plate is placed where plasma is formed. Growing of carbon tubelets and graphite crystals is performed inside the plasma cavity 3.

Figure 2:
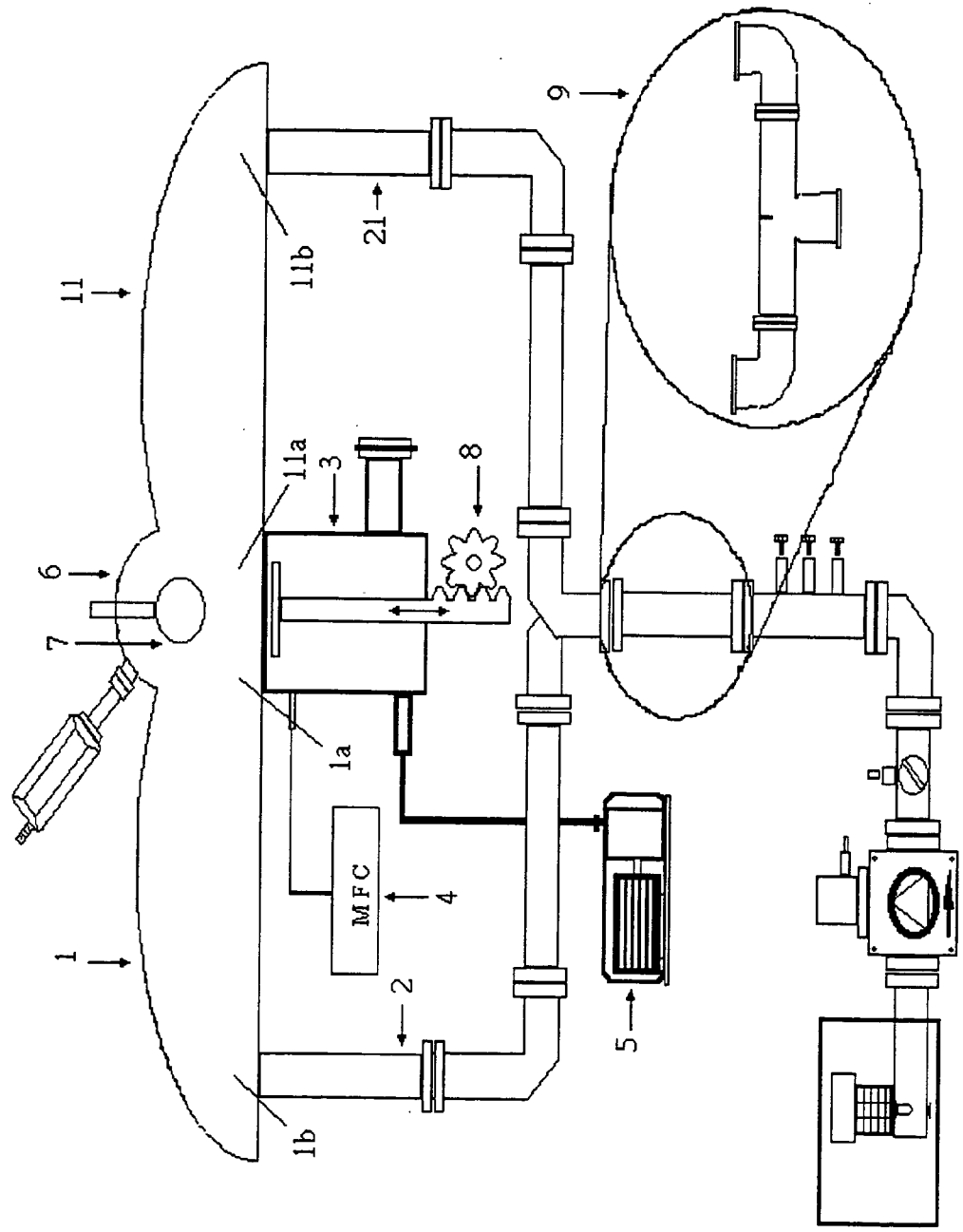
FIG. 2 is a schematic illustration of the plasma generating device of the present invention in the second embodiment.

Referring to FIG. 2, in a second embodiment of the present invention, a splitter Q distributes microwave power from a single source between the wave guiding devices 2, 21 to be led to the second foci 1$b$, 11$b$.

In other embodiments of the present invention, the cavities 1,11 are placed on different heights. The plasma cavity 3 is shaped like a cylinder or has another shape. The wave guiding input devices 2, 21 are tube-shaped wave guides or uniaxial antennae. Various embodiments are realized according to needs.

Figure 3:
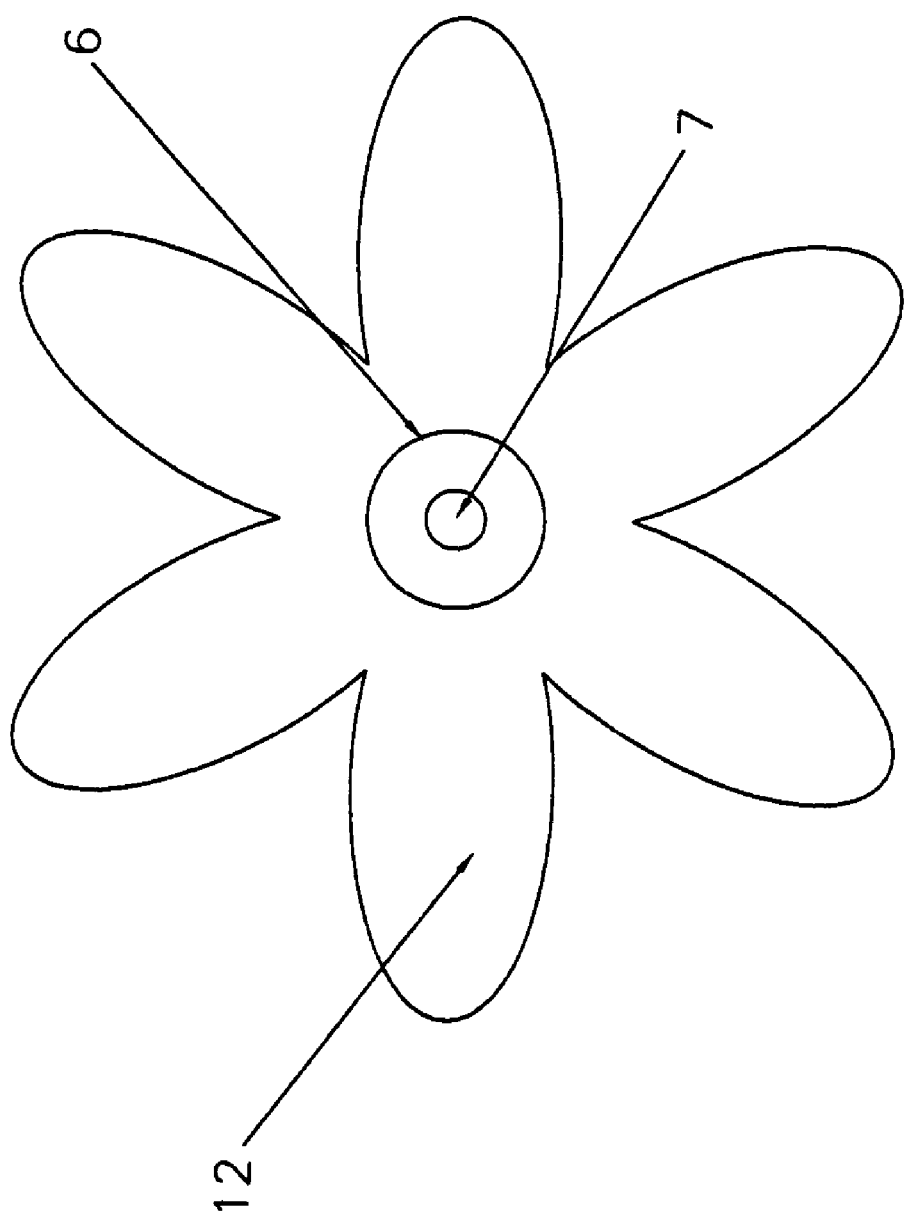
FIG. 3 is a top view of the spherical space and the cavities of the present invention in an embodiment having multiple cavities.

Referring to FIG. 3, in a further embodiment of the present invention, a plurality of cavities 12, each shaped like a half ellipsoid, are used. The cavities 12 have first foci placed closely to each other and in the upper part of the plasma cavity 3, so that a large volume of plasma is generated. The wave guides device 2, 21 lead microwaves selectively to the cavities 12 for optimum field distribution and stability.

While the invention has been described with reference to preferred embodiments thereof, it is to be understood that modifications or variations may be easily made without departing from the spirit of this invention which is defined by the appended claims.

The invention claimed is:

1. A plasma generating device, comprising:
    a hollow cylinder having an upper end, a lower closed end, and an essentially vertical longitudinal axis;
    a dielectric plate, having an upper surface and a lower surface, disposed horizontally on said upper end of said hollow cylinder;
    a hemispherical dome above said upper surface of the dielectric plate, said hemispherical dome being coaxial with said hollow cylinder;
    a plasma cavity comprising the space defined by said hemispherical dome and said hollow cylinder;
    at least one pair of excitation cavities, each of said pair of excitation cavities shaped like a half of a longitudinally divided ellipsoid, said excitation cavities disposed on said upper surface of the dielectric plate on opposite sides of said hemispherical dome and along a horizontal diametral line thereof, a convex side of said excitation cavities oriented in an upper direction, said excitation cavities having first foci and second foci, said excitation cavities intersecting said hemispherical dome with said first foci of said excitation cavities being located within said plasma cavity;
    at least one of wave guiding devices, guiding microwaves to said excitation cavities at said second foci thereof; and
    an adjustable field regulating device housed in said hemispherical dome, controlling an electromagnetic field distribution inside said plasma cavity;
    wherein plasma is generated in said plasma cavity by microwaves.

2. The plasma generating device according to claim 1, wherein said plasma cavity further comprises:
    a gas feeding device for feeding reaction gas to be converted into plasma; and
    a pumping device for controlling pressure inside said plasma cavity.

3. The plasma generating device according to claim 1, wherein said field regulating device has a spherical shape, controlling an electromagnetic field distribution inside said plasma cavity.

4. The plasma generating device according to claim 1, further comprising a vertical shifting device which allows vertical adjustment of said field regulating device.

5. The plasma generating device according to claim 1, further comprising a substrate carrier plate having a device for vertical positioning thereof, independently of said vertical shifting device for said field regulating device.

6. The plasma generating device according to claim 1, wherein said wave guiding devices are tube-shaped wave guides.

7. The plasma generating device according to claim 1, wherein said wave guiding devices are uniaxial antennae.

8. The plasma generating device according to claim 1, wherein said wave guiding devices are fed by a plurality of microwave sources.

9. The plasma generating device according to claim 1, wherein said wave guiding devices are fed by a single microwave source, with a splitter-distributing microwave power between said wave guiding devices.

10. The plasma generating device according to claim 1, wherein said wave guiding devices provide said cavities with a selected level of microwave power.

* * * * *